(12) United States Patent
Harrison

(10) Patent No.: US 8,723,531 B2
(45) Date of Patent: May 13, 2014

(54) INTEGRATED VSWR DETECTOR FOR MONOLITHIC MICROWAVE INTEGRATED CIRCUITS

(75) Inventor: Jose Harrison, North Andover, MA (US)

(73) Assignee: SiGe Semiconductor, Inc. (CA)

(*) Notice: Subject to any disclaimer, the term of this patent is extended or adjusted under 35 U.S.C. 154(b) by 484 days.

(21) Appl. No.: 12/714,692

(22) Filed: Mar. 1, 2010

(65) Prior Publication Data

US 2010/0231236 A1 Sep. 16, 2010

Related U.S. Application Data

(60) Provisional application No. 61/159,626, filed on Mar. 12, 2009.

(51) Int. Cl.
*G01R 27/32* (2006.01)

(52) U.S. Cl.
USPC .......................................... 324/637; 324/645

(58) Field of Classification Search
USPC .................................................. 324/645
See application file for complete search history.

(56) References Cited

U.S. PATENT DOCUMENTS

| | | | | |
|---|---|---|---|---|
| 5,196,805 A | * | 3/1993 | Beckwith et al. | 330/54 |
| 5,432,473 A | * | 7/1995 | Mattila et al. | 330/133 |
| 5,977,831 A | * | 11/1999 | Davis et al. | 330/279 |
| 5,994,965 A | * | 11/1999 | Davis et al. | 330/295 |
| 6,597,244 B2 | * | 7/2003 | Tichauer | 330/298 |
| 6,625,428 B1 | * | 9/2003 | Finnell et al. | 324/501 |
| 7,053,631 B2 | * | 5/2006 | Weese | 324/646 |
| 7,126,428 B2 | * | 10/2006 | Lin et al. | 330/311 |
| 7,512,386 B2 | * | 3/2009 | Kalajo et al. | 455/127.1 |
| 7,561,854 B2 | * | 7/2009 | Manicone | 455/83 |
| 7,865,145 B2 | * | 1/2011 | Neustadt et al. | 455/67.11 |
| 8,155,037 B2 | * | 4/2012 | Kasai et al. | 370/310 |
| 8,245,179 B2 | * | 8/2012 | Inoue | 716/136 |
| 2005/0059362 A1 | * | 3/2005 | Kalajo et al. | 455/127.1 |
| 2007/0010216 A1 | * | 1/2007 | Neustadt et al. | 455/115.1 |
| 2008/0234574 A1 | * | 9/2008 | Hancock et al. | 600/430 |
| 2009/0161586 A1 | * | 6/2009 | Kasai et al. | 370/294 |

* cited by examiner

*Primary Examiner* — Thomas F Valone
(74) *Attorney, Agent, or Firm* — Knobbe, Martens, Olson & Bear, LLP (57) ABSTRACT

An integrated RF circuit has an RF input port and an RF output port coupled to an external circuit element having known impedance such as an antenna. An RF circuit element is disposed between the RF input port and the RF output port and has a first input port and a first output port. The RF circuit element affects a signal received at the first input port and provides the affected signal to the first output port. The integrated RF circuit also has a VSWR detector circuit that measures a ratio of a characteristic of RF signals at the first input port and the first output port and that provides an indication of the ratio at a VSWR output port. The measured ratio of the characteristic is affected by an impedance of the coupling thereby providing an indication relating to the coupling.

21 Claims, 5 Drawing Sheets

INTEGRATED VSWR DETECTOR FOR MONOLITHIC MICROWAVE INTEGRATED CIRCUITS

FIELD OF THE INVENTION

The invention relates to monolithic integrated circuits (MIC), and more particularly to a method and system for determining a quality of an impedance match between a MIC and an external component coupled thereto.

BACKGROUND OF THE INVENTION

In recent years, the use of wireless and RF technology has increased dramatically in portable and hand-held units. Portable RF devices have become widespread and pervasive in the consumer electronic market and their uses now include telephony, Internet e-mail, Internet video, Internet web browsers, global positioning, photography, navigation systems, in-store navigation, and linking peripherals to host devices. In fact, the number of cellular telephone subscribers alone worldwide is expected to reach 3 billion by the end of 2008, up from 2.1 billion in 2005, according to the International Telecommunication Union (ITU).

Similarly the devices incorporating wireless technology have expanded, and continue to so, including today not only cellular telephones, but Personal Digital Assistants (PDAs), laptop computers, palmtop computers, gaming consoles, wireless local area networks, wireless hubs, printers, telephone headsets, portable music players, point of sale terminals, global positioning systems, inventory control systems, and even vending machines. Whilst lagging cellular telephone subscribers today, for example 2007 consumption of wireless home devices was only approximately 134 million units, and is projected to exceed over 500 million units per annum by 2012 the overall market will likely exceed cellular telephone units as consumers procure multiple wireless devices per household.

These wireless devices interface to wireless infrastructures that can support data, voice and other services on either single or multiple standards. Typical examples of wireless standards in significant deployment today include, but are not limited to:

WiFi [ANSI/IEEE Standard 802.11];
WiMAX [IEEE Standard 802.16];
Bluetooth [IEEE Standard 802.15.1];
Industrial, Scientific and Medical (ISM) [International Telecommunications Union Recommendations 5.138, 5.150, and 5.280]; and
GSM 850/900/1800/1900 [European Telecommunications Standards Institute (ETSI)] and it's extensions General Packet Radio Service (GPRS) and Enhanced Datarates for GSM Evolution (EDGE).

Not surprisingly, in all such consumer markets, pricing of the finished product is often a major factor in its commercial success. Moreover, as product features for portable electronic devices within each category, such as cellular telephones, become harmonized across multiple vendors greater pressure on reducing the cost of components and improving final yield arises. Accordingly, the cost pressure has led to the monolithic integration of the RF electronics to a small number of integrated circuits (ICs) incorporated onto radio boards. Typically, these ICs are manufactured using silicon for the baseband or computationally intensive elements of the signal processing and from silicon germanium, gallium arsenide, and indium phosphide for the RF circuit that forms the microwave circuit path. The microwave circuit path can be traced from the mixers upconverting/downconverting the RF signals via amplifiers, microwave filters, circulators, etc. to the RF antenna of the device. The RF circuit is also commonly referred to as a monolithic microwave integrated circuit (MMIC).

This RF circuit and the RF system it forms part of are often tested during various stages of the assembly process using conductive or operational testing to ensure the product functionality and to prevent further assembly of a non-functioning product. Clearly, further assembly of a defective subcomponent represents wasted investment and time that must be absorbed into the pricing of the non-defective units. Hence, the RF MMIC may be tested at the final stage of manufacturing of the semiconductor wafer, as a discrete MMIC after separation from the wafer, as part of the circuit board assembly of the wireless device, and/or as part of the final product testing.

In each instance, the making of an electrical connection with the MMIC may result in damage or destruction of the interface of the MMIC circuit if a severe and unintended mismatch is present. One example of such an electrical connection is plugging of an antenna into the assembly/subassembly, and conducting a radiated test of the final product. Occasionally, the act of plugging in the antenna damages or destroys the connection, resulting in an open circuit at the connector. Alternatively, the antenna receptacle itself has been damaged in some previous manufacturing operation and, unbeknownst to the test operator, the antenna will not connect properly to the sub-assembly. An open circuit presented to the output of an RF front end can result in excessive RF voltage swings brought on by the mismatch at the antenna connection. Such over-voltages can result in permanent damage to the front end, causing a reject at the final step of the assembly process where the product has its highest cost.

It would be advantageous to provide a method or circuit for reducing the damage caused or the costs incurred during manufacturing due to mismatched test coupling.

SUMMARY OF THE INVENTION

In accordance with an aspect of the invention there is provided an apparatus comprising: an integrated RF circuit comprising: an RF input port; an RF output port for being coupled with a known impedance to an external circuit element; at least an RF circuit element disposed along a path between the RF input port and the RF output port and comprising a first input port and a first output port and for affecting a signal received at the first input port and providing the affected signal to the first output port; and, a VSWR detector circuit including a VSWR output port and integrated within the integrated RF circuit, the VSWR detector circuit for measuring a ratio of a characteristic of RF signals at the first input port and a same characteristic of the RF signals at the first output port and for providing an indication of the ratio at the VSWR output port, the measured ratio of the characteristic affected by an impedance of the coupling.

In accordance with another aspect of the invention there is provided a method comprising: providing an RF signal at a first port; measuring a first characteristic of the signal at the first port; propagating the RF signal via at least a signal conditioning circuit to a second other port; measuring a same first characteristic of the signal at the second other port; and, providing an indication of a ratio of the first characteristic of the RF signal at the first port and the same first characteristic of the RF signal at second other port, a difference therebetween affected by an impedance of the coupling.

In accordance with another aspect of the invention there is provided a method comprising: providing an integrated microwave circuit comprising at least an RF input port, an RF output port, and one RF circuit element for processing an RF signal, the RF circuit element comprising at least an input port and an output port; providing a VSWR detector circuit integrated within the integrated RF circuit, the VSWR detector circuit for measuring a ratio of a characteristic of RF signals at the input port of the RF circuit element and the same characteristic of the RF signals at the output port of the RF circuit; attaching an antenna to the RF output port; operating the integrated RF circuit in a first mode of operation for allowing the VSWR of the antenna connection to be determined with the VSWR detector circuit without damaging the integrated RF circuit; and determining whether the antenna connection is acceptable, the determination made in dependence upon measured VSWR.

BRIEF DESCRIPTION OF THE DRAWINGS

Exemplary embodiments of the invention will now be described in conjunction with the following drawings, in which.

DETAILED DESCRIPTION OF EMBODIMENTS OF THE INVENTION

The drop-out yield of different manufacturing stages multiplied by the value of the product at each stage represents an enormous financial loss that a manufacturer must recoup from the profit on functionally acceptable and shipped products when products fail. As such, it is desirable to measure a quality of the electrical connections to an RF MMIC prior to operating the RF MMIC at levels where damage may occur to the RF MMIC. For example, it would be beneficial to provide a high-Voltage Standing Wave Ratio (VSWR) indictor or detector between an MMIC circuit and an antenna. A matched connection from the MMIC to the antenna has a VSWR of 1 whereas at either extreme of a short-circuit or open-circuit, the VSWR is infinity. Hence, the higher the VSWR, the poorer the match to the antenna and the more RF power will be reflected back into the MMIC. Measuring the VSWR allows for MMIC operation to be limited when mismatches occur to prevent damage to the MMIC when a problem in manufacturing exists outside the MMIC but affecting same.

However, typical prior art VSWR detectors are designed for operation with microwave systems using cable or waveguide connections, with high-quality, quarter-wavelength directional couplers to sample the forward and reverse propagating signals and are inserted or tapped as part of manual testing of assemblies. These are poorly suited to use in the low cost, high volume wireless device market.

In a circumstance, for example where the antenna is incapable of connecting the sub-assembly, such an innovation would allow the manufacturer to avoid introducing more damage to the defective sub-assembly and allows for repairing a defective unit prior to testing. As such, VSWR detection for the low cost, high volume wireless device market would be advantageous.

Figure 1:
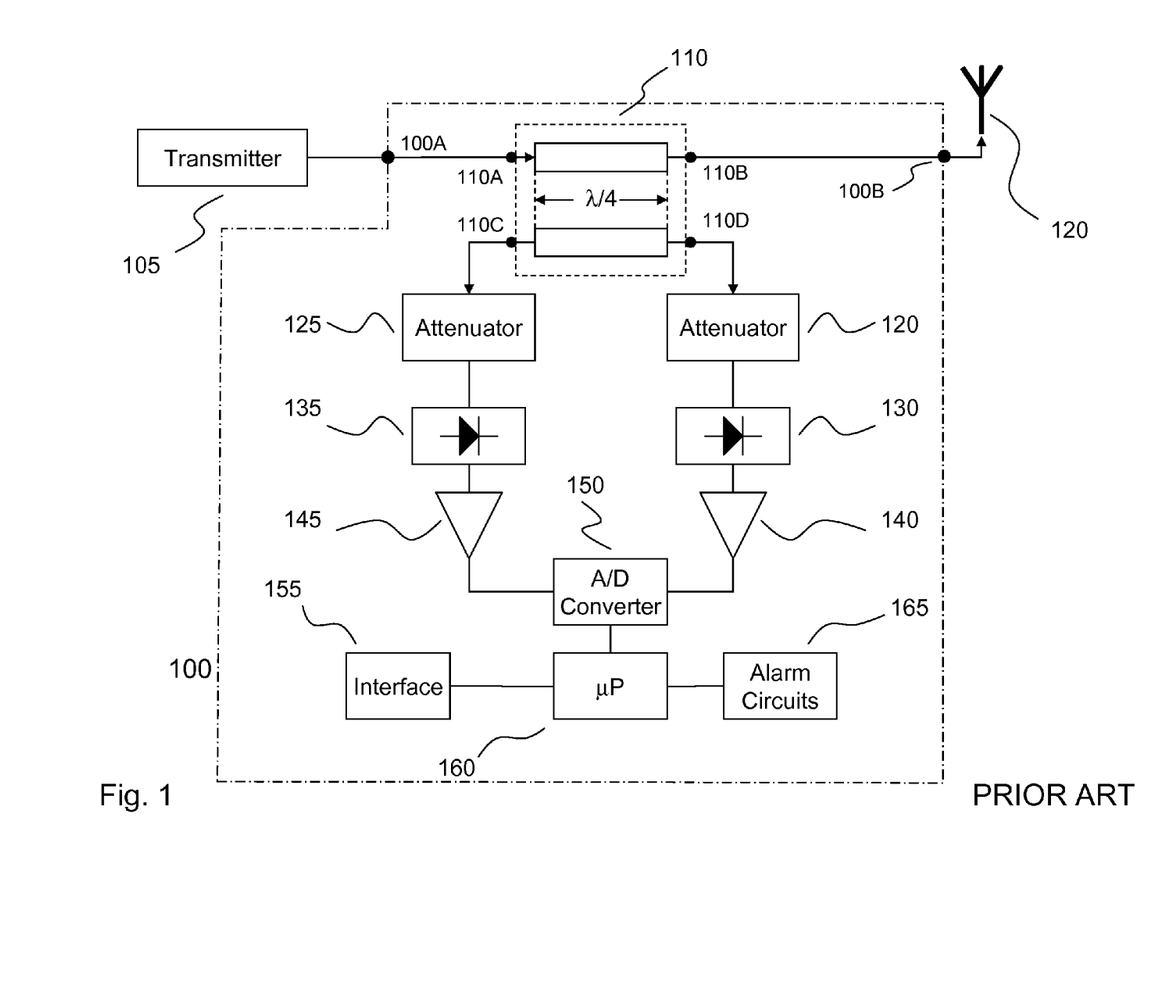
FIG. 1 illustrates a prior art VSWR detector for microwave systems based upon high-quality, quarter-wavelength directional coupler.

Referring to FIG. 1 there is shown a typical prior art VSWR detector 100 according to John Swank (US Patent Application 2002/0113601 "VSWR Monitor and Alarm"). The detector according to Swank is inserted/removed from the microwave path for the measurements, and thereby does not provide a measurement of the final signal as to be used for effecting signals within a microwave path.

As shown, the VSWR detector 100 is interfaced at first port 100A to a transmitter 105 that is providing an RF signal to be transmitted, and to the antenna for transmitting this RF signal at second port 100B. The first port 100A is connected to input port 110A of a quarter-wavelength directional coupler 110 such that a predetermined percentage of the RF signal provided by the transmitter is tapped and provided at a fourth port 110D of the quarter-wavelength directional coupler 110; the remainder of the RF signal is provided to second port 110B of the quarter-wavelength directional coupler 110 and thereupon to the antenna 120. Any power reflected from the antenna 120 is coupled back via the second port 100B and thereupon to input port 110A of the quarter-wavelength directional coupler 110. The quarter-wavelength directional coupler 110 provides at a third port 110C the predetermined percentage of the reflected RF signal from the antenna.

The forward propagating tapped signal, being transmitted from the transmitter 105 to the antenna 120, present at fourth port 110D is coupled via first attenuator 120 to first RF detector 130. The converted DC electrical signal from the first RF detector 130 is then amplified with first amplifier 140 before being fed to A/D converter 150. The A/D converter 150 provides a digital representation of the DC electrical signal, which is dependent upon the RF power incident at the first port 100A of the VSWR detector 100.

Similarly, the reverse propagating tapped signal, being transmitted from the antenna 120 to the transmitter 105, present at third port 110C is coupled via second attenuator 125 to second RF detector 135. The converted DC electrical signal from the second RF detector 135 is then amplified with second amplifier 145 before being fed to A/D converter 150. The A/D converter 150 provides a digital representation of the DC electrical signal, which is dependent upon the RF power incident at the first port 100B of the VSWR detector 100.

The output signal from A/D converter 150 is received and processed by microprocessor 160 thereby generating an indication of the VSWR inherent to the connection from the second port 100B to the antenna 120. The resulting VSWR measurement is then provided to the interface 155 wherein it can be communicated to a computer or other equipment forming part of the testing environment. Additionally, if the VSWR is above a predetermined threshold the microprocessor 160 triggers one or more alarm circuits 165. Unfortunately, the directional coupler results in losses in the forward transmission path and removal of the directional coupler would allow for a savings of approximately 1 dB.

Figure 2:
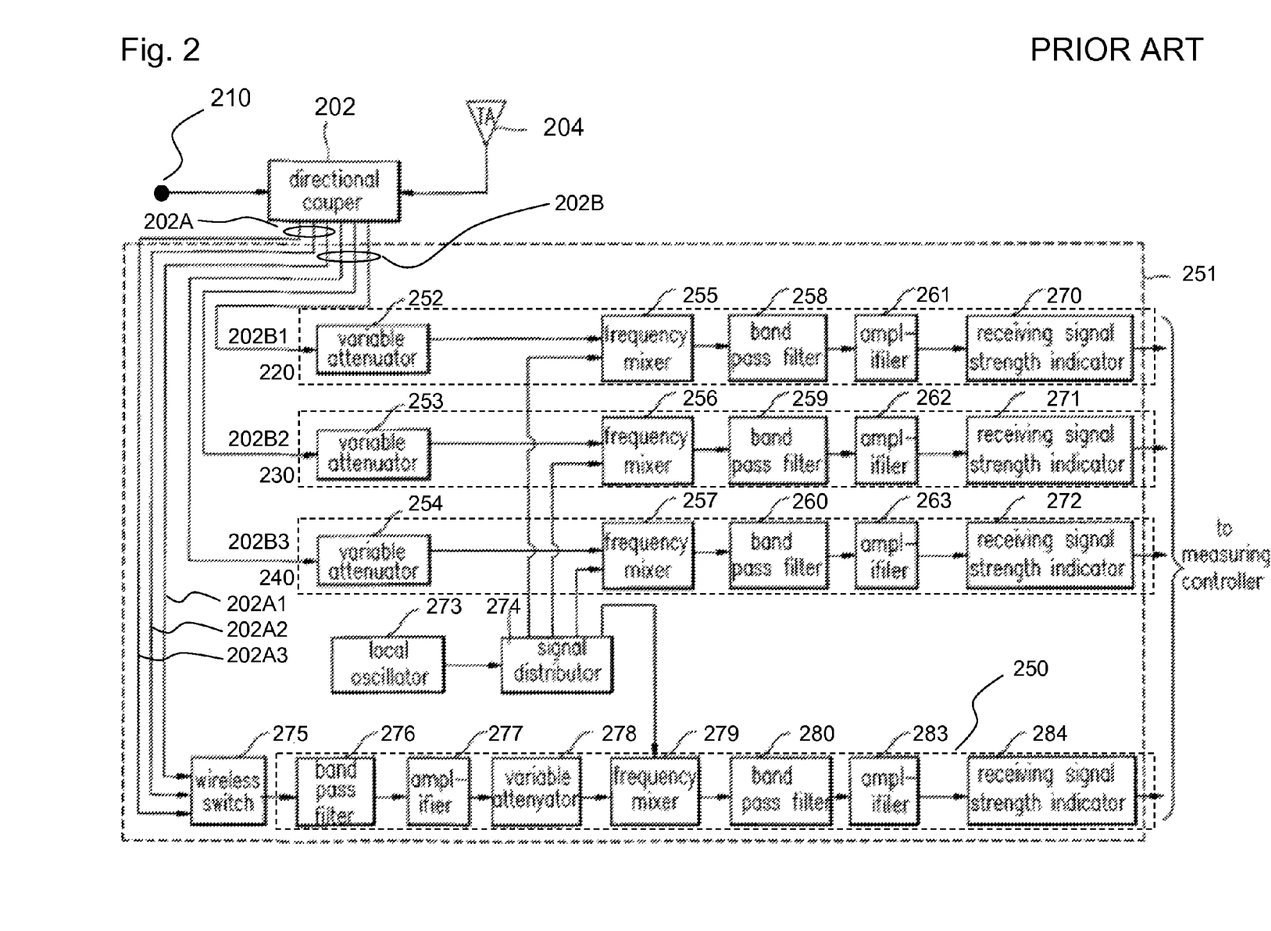
FIG. 2 illustrates a prior art VSWR detector for microwave systems based upon a directional coupler and operating upon multiple frequency bands.

Referring to FIG. 2, there is shown a second prior art VSWR detector 251 according to Il Yong Jeong (U.S. Pat. No. 6,178,310 "Transmitting and Receiving Antenna Voltage Standing Wave Ratios Measuring Circuit of Base Station in Mobile Communication System"). As shown, an RF signal is applied to port 210, this being the signal to be broadcast by the antenna 204. Disposed between port 210 and antenna 204 is directional coupler 202 having two groups of tapped ports 202A and 202B, each shown with three taps 202A1 through 202A3 and 202B1 through 202B3, respectively. The second group of taps, 202B1 through 202B3 are coupled to variable attenuators 252, 253, and 254 respectively for attenuating the RF signal coupled from the directional coupler 202.

Each of the variable attenuators 252 through 254 are coupled to frequency mixers 255, 256, and 257, respectively, for down-converting the tapped RF signals, the mixing performed in dependence of the local oscillator 273 which is distributed via signal distributor 274 to the frequency mixer 255 through 257. There are also provided bandpass filters 258 through 260 for filtering off signals outside of an IF band, the as filtered signals then being coupled to amplifiers 261 through 263 coupled to bandpass filters 258 through 260, respectively, for filtering the IF and then sending these to receiving signal strength indicators 270 through 272, which forward the resulting conversion to a measuring controller, not shown for clarity.

The first group of taps 202A1 through 202A3 are all coupled to an RF switch 275 for selecting one of the three ports. The output signal of the RF switch 275 is fed to band pass filter 276 for filtering off signals outside of the radio frequency band and thereafter an RF amplifier 277 for amplifying the resulting filtered radio frequency signal. A variable attenuator 278 is coupled to the output of the amplifier 277 for attenuating the amplified transmitting radio frequency signal, which is then coupled to a frequency mixer 279 for down-converting the radio frequency. The frequency mixer 279 is also coupled to the signal distributor 274 to receive the local oscillator 273.

The resulting IF signal is then coupled via a band pass filter 280 for filtering off signals outside of the IF band, the filtered IF signal then being amplified by amplifier 283 and coupled to a receiving signal strength indicator 284. The resulting signal from the conversion is fed to the measuring controller. Accordingly VSWR detector 251 provides three independent forward propagating signal measurement channels 220 through 240 coupled to the second group of tapped ports 202B1 through 202B3, respectively. The VSWR detector 251 provides a single reverse propagating signal measurement channel 250 which is coupled to the first group of tapped ports 202A1 through 202A3, respectively, via RF switch 275. Accordingly the VSWR detector 251 of Jeong is intended to provide a VSWR measurement for a base station operating at multiple frequencies wherein the antenna 204 is mounted upon a tower and connected to the base station electronics in a remote cabinet.

The prior art VSWR detectors of Swank and Jeong presented in respect of FIGS. 1 and 2 are intended for discrete installation test measurements (whereupon the VSWR detector is removed from the RF signal path after test) and testing multiple frequency bands within an installation test environment. Neither are targeted at providing a VSWR detector that is extremely low cost and integrated with an RF MMIC amplifier directly coupled to an antenna.

Figure 3:
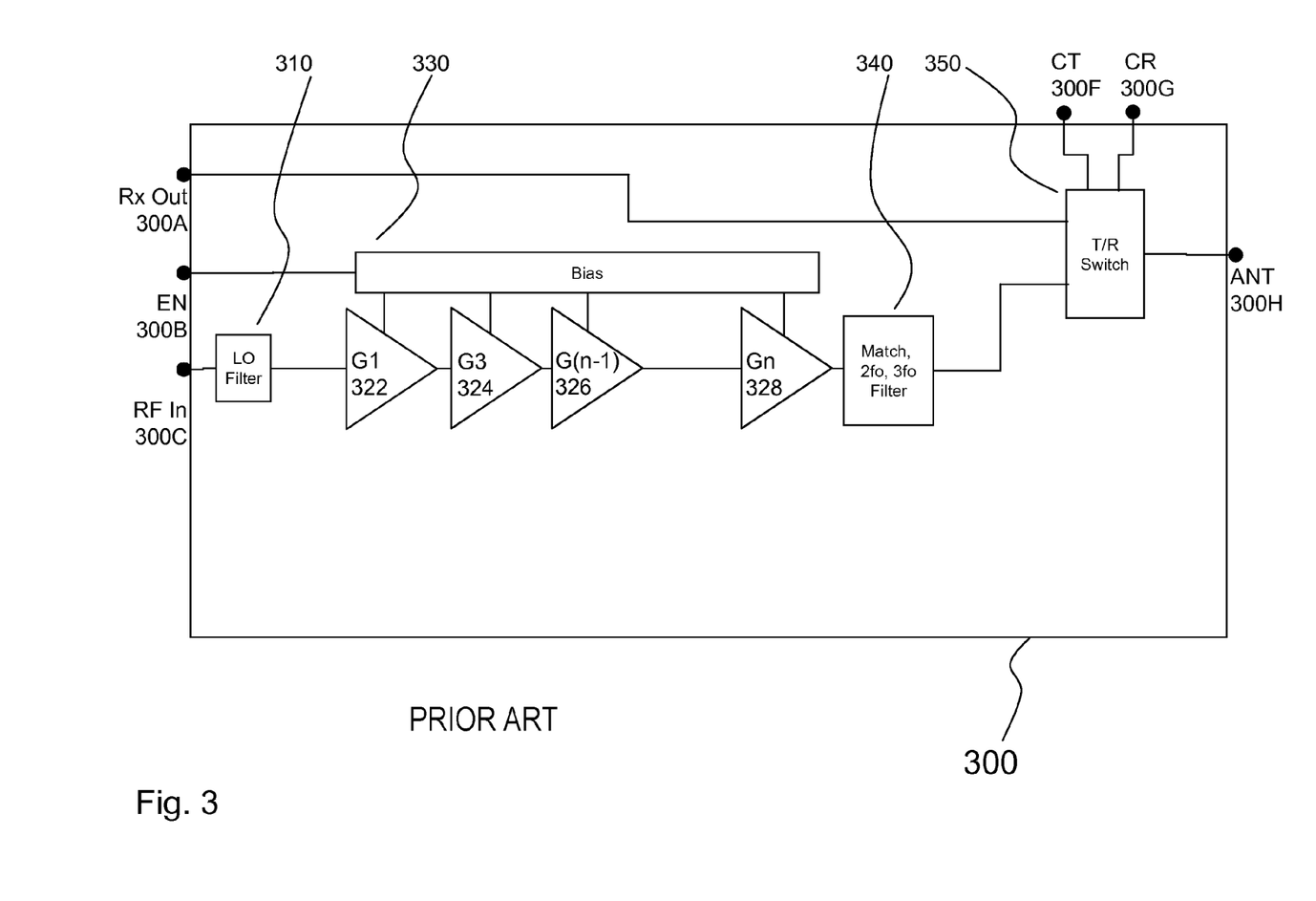
FIG. 3 illustrates a prior art RF MMIC amplifier for a wireless device.

A typical bidirectional RF MMIC amplifier 300 is shown in FIG. 3. The bidirectional RF MMIC amplifier 300 has an antenna port 300H that is connected to transmit/receive switch 350, the transmit/receive switch 350 being controlled via port CT 300F and port CR 300G. Under port CR 300G control, the transmit/receive switch couples the antenna port 300H to receive port 300A. As shown, there are no RF circuit elements within the receive path, however, optionally the receive path includes RF circuit elements such as a band pass filter, RF amplifier, and RF mixer.

Where the transmit/receive switch 350 is under control of port CT 300F, the antenna port 300H is connected to the output port of matching filter 340. The matching filter 340 is for filtering the final gain output stage G(n) 328 of an n-stage amplifier comprising first stage G(1) 322, second stage G(2) 324, and penultimate stage G(n−1) 326. Each gain stage 322 through 328 of the n-stage amplifier is connected to a bias control circuit 330 which is connected to enable port 300B that provides for enabling/disabling the n-stage amplifier according to the status of the device containing the bidirectional RF MMIC amplifier 300. The first gain stage G(1) 322 is connected to the RF input port 300C via low frequency filter 310.

According to the prior art of Swank and Jeong presented supra in respect of FIGS. 1 and 2, each of the VSWR detector solutions in the prior art would be disposed at some point between the antenna port 300H and the remote antenna, not shown for clarity. However, as described supra it would be beneficial for the VSWR detector to be directly integrated with the bidirectional RF MMIC amplifier 300 thereby allowing measurement of the VSWR with a directly attached antenna and also at preceding points in the manufacture and test of the bidirectional RF MMIC amplifier 300. Moreover, integration of the high-VSWR detector provides a means to control other aspects of the RF MMIC including the signal processing qualities.

Figure 4:
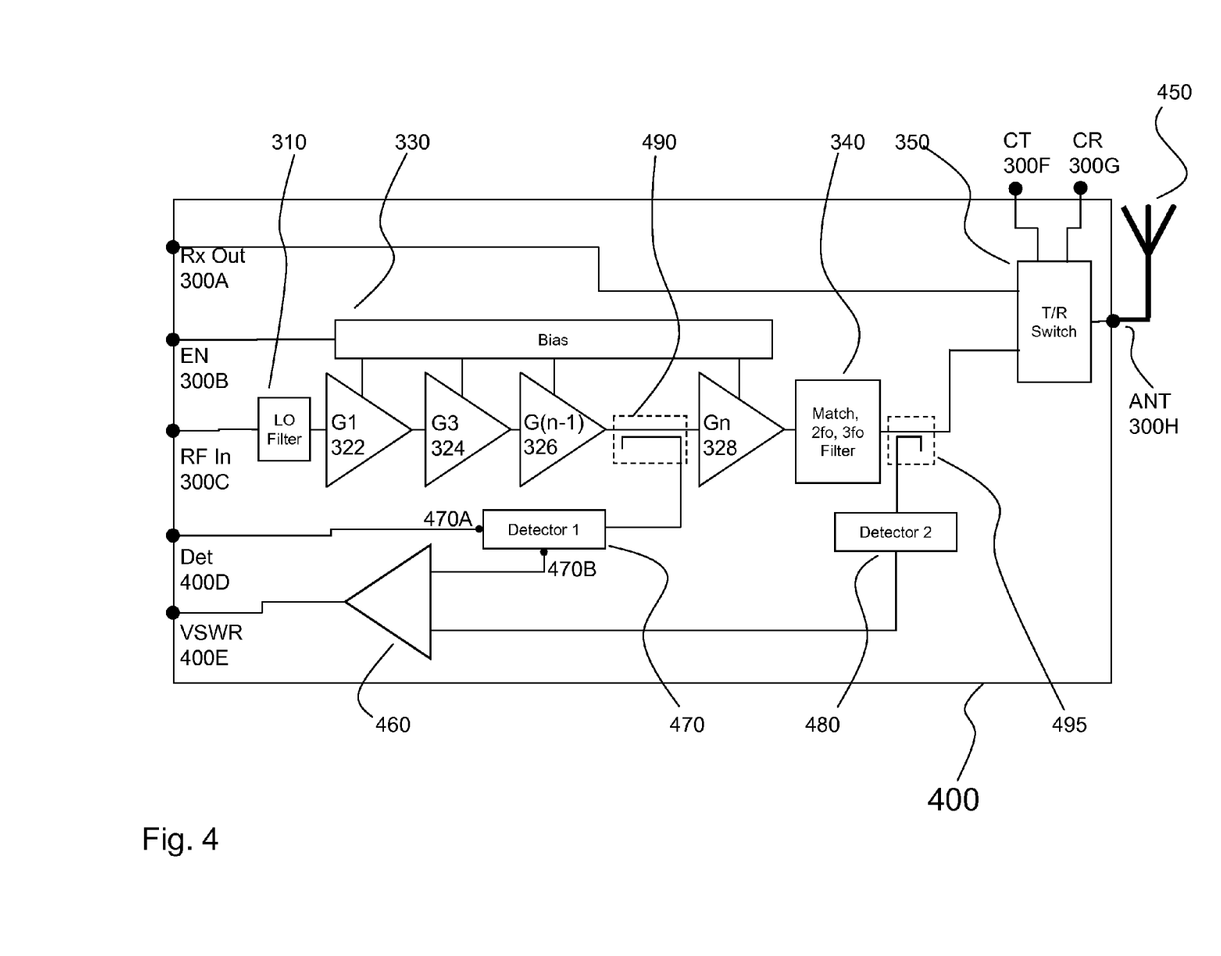
FIG. 4 illustrates a first embodiment of the invention to provide a VSWR detector within an RF MMIC amplifier.

Referring to FIG. 4, an embodiment of the invention is shown with respect to a bidirectional RF MMIC with VSWR circuit 400. As shown the bidirectional RF MMIC with VSWR circuit 400 comprises an n-stage amplifier comprised of first stage G(1) 322, second stage G(2) 324, penultimate stage G(n−1) 326, and final stage G(n) 328. The RF signal to be amplified is coupled to the RF input port 300C and coupled to the first stage G(1) 322 via a low frequency filter 310. The output port of the n-stage amplifier is coupled to the antenna 450 directly via transmit/receive switch 350 at port 300H of the bidirectional RF MMIC with VSWR detection circuit 400. As with the bidirectional RF MMIC amplifier 300 the transmit/receive switch 350 is controlled via ports CT 300F and CR 300G. The transmit/receive switch 350 is also directly connected to the RF receive port 300A, whilst this is shown without any circuit elements the RF receive path optionally includes microwave circuit elements and optionally includes baseband or DC circuitry including but not limited to an amplifier, mixer, and RF detector.

The bidirectional RF MMIC with VSWR circuit 400 comprises a first coupler 490 that couples to first detector 470 and is disposed between the penultimate gain stage G(n−1) 326 and final gain stage G(n) 328. Optionally, first coupler 490 is a directional coupler. First detector 470 provides incident power measurement by virtue of sampling the RF signal within the n-stage amplifier of the RF MMIC with VSWR circuit 400. A first output port 470A of the first detector 470 is coupled to a detector output port 400D allowing control of the RF MMIC with VSWR circuit 400 by a controller, not shown for clarity.

A second output port 470B of the first detector 470 is coupled to comparator 460. The other input port of the comparator 460 is coupled to the output port of a second detector 480. The input port of the second detector is coupled to an output port of a second coupler 495 that couples a predetermined portion of any RF signal arising from the final stage G(n) 328 or RF signal reflected from the transmit/receive switch 350 or, in fact, the RF signal reflected from antenna 450 through the transmit/receive switch 350. In normal operation, the transmit/receive switch 350 has low loss and appears transparent to the output impedance presented by the connected antenna 450. The output signal of the comparator 460 is coupled to VSWR port 400E. With less buffering from the antenna mismatch, the second detector 480 located at an output port of final stage detects the combination of the incident and reflected power. In contrast, the first detector 470 tends to be highly buffered from the effects of mismatch because of the isolating effect of the final stage G(n) 328. However, the first detector 470 may not provide as accurate an indication of the power of the RF signal launched to the antenna 450 in a properly matched circumstance because of the variability of the RF signal power gain in the final stage G(n) 328. In other words, the first detector 470 is more accurate in providing an indication of the RF power provided by the multistage amplifier in circumstances of mismatch but less so compared to the second detector 480 when the amplifier 400 is properly matched to the antenna 450.

In operation, the comparator 460 compares the output voltage of the two detectors, first detector 470 before the final gain stage G(n) 328 and second detector 480 after the final gain stage G(n) 328. When the comparator error exceeds a predetermined limit, for example as set by the application, the output signal of the comparator toggles from a logic "low-VSWR" state, which can be logic high or low or an analog voltage output signal, to the opposite "high-VSWR" state to indicate the presence of a high mismatch at the antenna port 300H. In a high-VSWR state, the power amplifier controller or test operator knows that increasing the power level at the input port or increasing the gain of the power amplifier using bias control, for example, has a greater risk of damaging the power amplifier as a result of excessive voltage on the final gain stage G(n) 328.

The two detector output voltages from the two detectors 470 and 480 are preferably calibrated at the same voltage level when the antenna port 400H is presented with proper matching, typically 50 ohms, to ensure proper operation. This can be achieved during wafer or die level testing of the bidirectional RF MMIC with VSWR circuit 400 with a microwave RF probe testing station. Optionally, two detectors according to the above configuration are used such that the indication of VSWR results in toggling between the use of the second detector or the first detector—one being more accurate than the other. Thus, detector selection is made in dependence upon the degree of mismatch.

Figure 5:
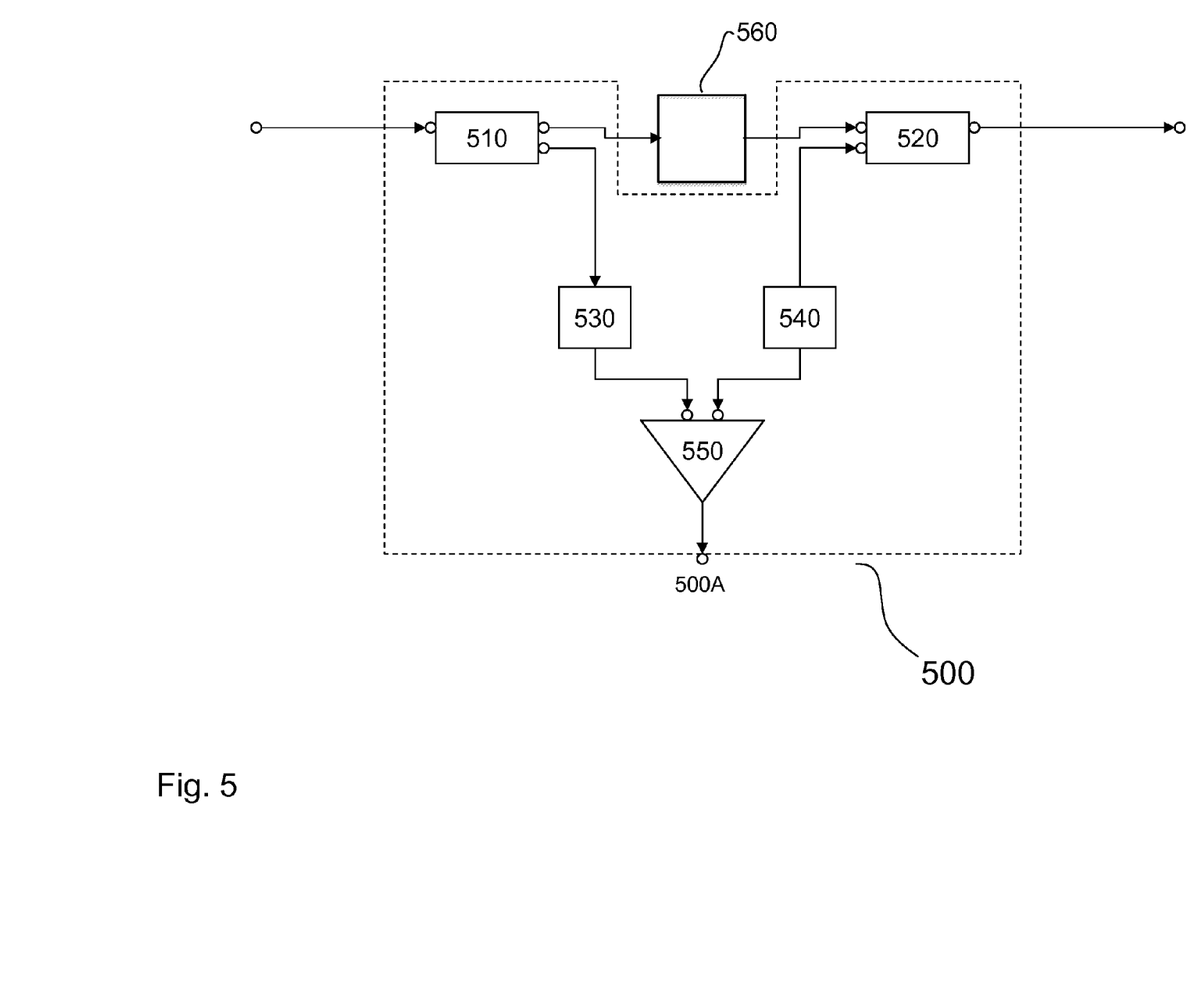
FIG. 5 illustrates a second embodiment of the invention to provide a VSWR detector within a generalized RF MMIC.

Referring to FIG. 5, there is shown a VSWR detector circuit 500 for providing a VSWR measurement at any serial component 560 within a MMIC circuit, not shown for clarity. As shown, the VSWR detector circuit 500 comprises a first coupler disposed between the preceding RF element of the MMIC circuit, not shown for clarity, and the serial component 560 and a second coupler disposed between the serial component 560 and the next RF element in the MMIC, not shown for clarity. Each of the first and second couplers provides a tapped RF signal to each of first detector 530 and second detector 540, respectively. The output signals of the two detectors 530 and 540 are coupled to comparator 500 resulting in a circuit for determining if a mismatch is present between the output port of the serial component 560 and the next RF element by providing a signal at port 500A. The VSWR circuit 500 functions by comparing the power of the input signal to the serial component 560 with power of the output signal that is presented to the next RF element in the MMIC. For example, assume that the serial component is an attenuator with 10 dB attenuation at the RF signal frequency of interest. Further assume that a 20 dBm signal is incident upon the input port of the attenuator. Clearly, following attenuation, it is expected that a signal with power equal to 10 dBm is passed on to the next RF element in the MMIC. However, if a mismatch between the output impedance of the attenuator and the next RF element arises—say for example because of damaged antenna connector, then some reflected power may manifest at the output port of the attenuator. Depending upon the phase of the reflected signal, a detector on the output port of the attenuator may measure a signal less than or greater than 10 dBm. When the signals from the detectors are compared, the result is a signal that provides an indication that a problem is present. Clearly, one cannot distinguish between a situation where there is a mismatch condition and a situation where the attenuator itself is damaged—say providing 15 dB of attenuation rather than 10 dB but it does provide the test operator or controller a signal upon which to act or deviate from standard testing—perhaps, for example, to visually examine more closely an antenna connector for damage. The key attribute of the serial component 560 is that it buffers the reflected power due to mismatch. That is, the reflected energy is diminished at the input port of the serial component 560 due to the loss it introduces in respect of RF signals, thereby creating detectable differences between the output signals of the two detectors 530 and 540 when compared with impedance matched operation, for example at 50 ohm. Optionally, the output signals from the directional couplers 510 and 520 are amplified, filtered, or down-converted prior to being coupled to the detectors 530 and 540, respectively. Also, optionally, the output signals of the detectors 530 and 540 are amplified prior to being coupled to the comparator 550.

Advantageously according to an embodiment, the VSWR circuit comprises as a minimum only a few circuit elements, two couplers, two RF detectors and a comparator. Accordingly, the VSWR circuit takes up a small amount of substrate area with simple circuit elements, namely couplers or taps, RF detectors and comparator. Additional elements, such as amplifiers if required, are equally not substantial die area consumers as they are relatively simple gain blocks without requirements for high linearity, low noise, high power, etc.

Preferably, the downstream coupler, the second coupler, is provided with little or no directivity such that a signal propagating upstream can be measured by the VSWR circuit.

Though the coupler described hereinabove is described coupled to a specific stage in a multistage amplifier, this is not intended to limit placement of the VSWR circuit within the integrated circuit. One of skill in the art will understand that the coupler is optionally placed about any of the gain stages or is used in a single gain stage implementation. Further, the couplers are optionally disposed about more than one gain stage within a chain of gain stages. Preferably, the VSWR circuit is calibrated based on where it is disposed within the overall circuit.

Though the above-described embodiments relate to linear amplifiers, the methods and circuits described herein are also applicable to non-linear amplifiers and other RF integrated circuits.

Numerous other embodiments may be envisaged without departing from the scope of the invention.

What is claimed is:

1. An RF circuit assembly comprising:
an n-stage amplifier disposed along a communication path and configured to amplify an RF signal, the communication path including an output port configured to couple to an antenna;
a voltage standing wave ratio (VSWR) detector circuit including a first detector disposed along the communication path within the n-stage amplifier and configured to measure incident power of the RF signal, a second detector disposed along the communication path after the n-stage amplifier and configured to measure a combination of incident and reflected power of the RF signal, and a comparator configured provide a comparator output signal based on a comparison of the incident power and the combination of incident and reflected power, the comparator output signal indicating an impedance of the coupling; and a controller configured to select the first detector of the VSWR detector circuit to measure RF signal power during operation of the RF circuit assembly when the comparator output signal is greater than an amount and to select the second detector of the VSWR detector circuit to measure the RF signal power during operation of the RF circuit assembly when the comparator output signal is less than the amount.

2. The RF circuit assembly of claim 1 wherein the n-stage amplifier has a buffering quality.

3. The RF circuit assembly of claim 1 wherein the n-stage amplifier includes a power amplifier.

4. The RF circuit assembly of claim 1 wherein the n-stage amplifier includes a signal conditioning circuit.

5. The RF circuit assembly of claim 1 wherein the combination incident and reflective power of the RF signal is associated with a range of frequencies reflected by the coupling.

6. The RF circuit assembly of claim 1 further comprising a circuit responsive to the comparator output signal to enable a predetermined portion of the RF circuit assembly when the comparator output signal is within a predetermined range and to disable the predetermined portion of the RF circuit assembly when the comparator output signal is outside the predetermined range.

7. The RF circuit assembly of claim 1 wherein the comparator output signal is indicative of an impedance match of the antenna.

8. The RF circuit assembly of claim 1 wherein the comparator output signal is indicative of reflectivity of electromagnetic signals beyond the coupling.

9. The RF circuit assembly of claim 1 wherein the VSWR detector circuit further includes a first coupler disposed along the communication path within the n-stage amplifier and configured to provide a first sampled portion of the RF signal to the first detector, and a second coupler disposed along the communication path after the n-stage amplifier and configured to provide a second sampled portion of the RF signal to the second detector.

10. The RF circuit assembly of claim 9 wherein the VSWR detector circuit is calibrated by applying the RF signal to an input port and terminating the output port with a 50 ohm impedance when the RF circuit assembly is powered.

11. The RF circuit assembly of claim 1 wherein an input port, the output port, the n-stage amplifier, and the VSWR detector circuit are integrated into a single integrated RF circuit.

12. A method comprising:
propagating an RF signal via at least a signal conditioning circuit within an n-stage amplifier disposed along a communication path between a first port and a second port configured to couple to an antenna;
measuring incident power of the RF signal within the at least a signal conditioning circuit with a first detector and measuring a combination of incident and reflective power of the RF signal after the at least a signal conditioning circuit with a second detector;
comparing the measured incident power of the RF signal from the first detector with the measured combination of incident and reflected power of the RF signal from the second detector to provide a voltage standing wave ratio (VSWR); and
selecting the first detector to measure RF signal power when the VSWR is greater than an amount and selecting the second detector to measure the RF signal power when the VSWR is less than the amount.

13. The method of claim 12 wherein the measured combination incident and reflective power includes at least a portion relating to the RF signal reflected from the coupling having an impedance mismatch.

14. The method of claim 13 wherein the reflected RF signal is diminished at the first detector due to loss introduced by the at least a signal conditioning circuit in a reverse direction relative to the reflected RF signal present at the second detector.

15. The method of claim 12 further comprising:
sampling a portion of the RF signal within the at least a signal conditioning circuit to form first samples;
sampling a portion of the RF signal after the at least a signal conditioning circuit to form second samples; and
based on the first and second samples, determining the VSWR.

16. The method of claim 12 wherein the at least a signal conditioning circuit includes at least one of an amplifier, a transistor, a mixer, and an attenuator.

17. The method of claim 12 further comprising calibrating the first and second detectors when the coupling is terminated with a 50 ohm impedance.

18. The method of claim 12 further comprising providing an impedance match correction signal configured to vary an output impedance based at least in part on the VSWR.

19. The method of claim 12 further comprising enabling at least a portion of an integrated RF circuit when the VSWR is within a range, and disabling the portion of the integrated RF circuit when the VSWR is outside the range.

20. The method of claim 12 further comprising operating an integrated RF circuit in a first mode of operation when the VSWR is within a range, and operating the integrated RF circuit in a second mode of operation when the VSWR is outside the range.

21. A method comprising:
providing an integrated microwave circuit including at least an n-stage amplifier disposed along a communication path and configured to amplify an RF signal, the communication path including an output port configured to couple to an antenna;
providing a voltage standing wave ratio (VSWR) detector circuit integrated within the integrated microwave circuit, the VSWR detector circuit including a first detector disposed along the communication path within the n-stage amplifier and configured to measure incident power of the RF signal, a second detector disposed along the communication path after the n-stage amplifier and configured to measure a combination of incident and reflected power of the RF signal, and a comparator configured provide a comparator output signal based on a comparison of the incident power and the combination of incident and reflected power, the comparator output signal indicating an impedance of the coupling;
connecting the antenna to the output port; and
selecting the first detector of the VSWR detector circuit to measure RF signal power during operation of the integrated microwave circuit when the comparator output signal is greater than an amount and selecting the second detector to measure the RF signals power during operation of the integrated microwave circuit when the comparator output signal is less than the amount.

* * * * *

UNITED STATES PATENT AND TRADEMARK OFFICE
CERTIFICATE OF CORRECTION

PATENT NO. : 8,723,531 B2
APPLICATION NO. : 12/714692
DATED : May 13, 2014
INVENTOR(S) : Harrison It is certified that error appears in the above-identified patent and that said Letters Patent is hereby corrected as shown below:

In the Claims

In column 8 at line 66, In Claim 1, after "configured" insert --to--.

In column 10 at line 54, In Claim 21, after "configured" insert --to--.

In column 10 at line 63, In Claim 21, change "signals" to --signal--.

Signed and Sealed this
Twenty-first Day of October, 2014

Michelle K. Lee
*Deputy Director of the United States Patent and Trademark Office*